(12) United States Patent
Matters-Kammerer

(10) Patent No.: US 7,839,622 B2
(45) Date of Patent: Nov. 23, 2010

(54) TRENCH CAPACITOR DEVICE SUITABLE FOR DECOUPLING APPLICATIONS IN HIGH-FREQUENCY OPERATION

(75) Inventor: Marion Matters-Kammerer, Valkenswaard (NL)

(73) Assignee: IPDIA, Caen (FR)

( * ) Notice: Subject to any disclaimer, the term of this patent is extended or adjusted under 35 U.S.C. 154(b) by 335 days.

(21) Appl. No.: 12/092,607

(22) PCT Filed: Nov. 3, 2006

(86) PCT No.: PCT/IB2006/054102

§ 371 (c)(1),
(2), (4) Date: May 5, 2008

(87) PCT Pub. No.: WO2007/054870

PCT Pub. Date: May 18, 2007

(65) Prior Publication Data

US 2008/0291603 A1    Nov. 27, 2008

(30) Foreign Application Priority Data

Nov. 8, 2005    (EP) .................................. 05110471

(51) Int. Cl.
*H01G 4/06*    (2006.01)
(52) U.S. Cl. ...................... 361/313; 361/311; 361/312; 361/301.4; 361/321.1; 361/321.2
(58) Field of Classification Search .............. 361/306.2, 361/306.1, 306.3, 303–305, 311–313; 257/295, 257/296
See application file for complete search history.

(56) References Cited

U.S. PATENT DOCUMENTS 3,427,708 A    2/1969    Schutze et al.

(Continued)

FOREIGN PATENT DOCUMENTS

EP    1227515 A2    7/2002
WO    2005088699 A1    9/2005

OTHER PUBLICATIONS

Roozeboom, F; et al "High-Density, Low-Loss MOS Capacitors for Integrated RF Decoupling" Proceedings 2001. International Symposium on Microelectronics (SPIE vol. 4587) IMAPS—International Microelectronics and Packaging Society, 2001, pp. 477-483.

(Continued)

*Primary Examiner*—Nguyen T Ha
(74) *Attorney, Agent, or Firm*—Hamre, Schumann, Mueller & Larson, P.C.

(57) ABSTRACT

A capacitor device, an electronic circuit comprising a capacitor device, an electronic component, and a method of forming a capacitor device are described. In the capacitor device, a current-path region extends from one of two trench capacitor electrodes to a respective contact structure. The current-path region is obtainable by thinning the substrate from an original substrate thickness down to reduced substrate thickness either in a lateral substrate portion containing the capacitor region or over the complete lateral extension of the substrate before forming the first and second contact structures. The capacitor device exhibits a reduced impedance in the current-path region. This reduced impedance implies a low self-inductance and self-resistance that is caused by the current-path region. The low self-inductance provides an improved signal suppression over a broadened spectral range in a circuit configuration that employs the capacitor device as a bypass capacitor between a signal line and ground potential.

17 Claims, 8 Drawing Sheets

U.S. PATENT DOCUMENTS

| | | | |
|---|---|---|---|
| 4,224,734 A | | 9/1980 | Tiefert et al. |
| 5,847,951 A | * | 12/1998 | Brown et al. ................. 363/147 |
| 5,939,782 A | * | 8/1999 | Malladi ....................... 257/698 |
| 6,346,743 B1 | * | 2/2002 | Figueroa et al. ............. 257/723 |
| 6,818,469 B2 | * | 11/2004 | Mori et al. .................... 438/52 |
| 6,888,716 B2 | * | 5/2005 | List et al. ................. 361/306.2 |

OTHER PUBLICATIONS

Goldfarb, M. E; et al "Modeling Via Hole Grounds in Microstrip" IEEE Microwave and Guided Wave Letters, vol. 1, Issue 6, Jun. 1991, pp. 135-137.

* cited by examiner

TRENCH CAPACITOR DEVICE SUITABLE FOR DECOUPLING APPLICATIONS IN HIGH-FREQUENCY OPERATION

FIELD

This disclosure relates to a capacitor device and to an electronic circuit comprising a capacitor device coupled in parallel between a signal line and a ground contact. This disclosure further relates to a method for manufacturing a capacitor device.

BACKGROUND

Trench capacitors are in use in electronic circuits as decoupling capacitors, also referred to as bypass capacitors herein, in a circuit configuration, wherein the capacitor is inserted in parallel between a signal line and ground potential.

In this configuration, trench capacitors offer the advantage of a small impedance, which is given by $$Z = 1/j\omega C \quad (1)$$

Here, Z denotes the impedance, $\omega$ is the circular frequency, and is related to a frequency f of a signal by $\omega = 2\pi f$, C is the capacitance, and j is the well known imaginary unit number. Trench capacitors typically have large capacitance values, and therefore represent a nearly perfect short circuit between the signal line and ground potential for alternating current (AC) signals. Equation (1) implies that the higher the capacitance, the better the short circuit to ground.

FIG. 1 shows a known trench capacitor structure 100 for achieving high capacitance values. This trench capacitor structure was published in F. Roozeboom et. al., "High-Density, Low-Loss MOS Capacitors for Integrated RF Decoupling", Int. J. Microcircuits and Electronic Packaging, 24 (3) (2001) pp. 182-196. The trench capacitor 100 of FIG. 1 is embedded in a silicon substrate 102 and comprises an array of coupled layer structures, of which layer structures 104 to 112 are shown in a cross-sectional view. The layer structures consist of an array of U-shaped cross-sectional profiles in a plane perpendicular to a top side 114 and a bottom side 116 of substrate 102. The U-shaped layer structures are identical, and corresponding layers of the layer structures are connected with each other. The layer structure comprises a first, lower electrode 118, which is formed by an $n^+$-silicon layer. This $n^+$-layer is present on an $n^-$-doped silicon substrate. A dielectric layer 120, which can for instance be a oxide/nitride/oxide layer stack of 30 nm thickness, isolates the lower electrode 118 from an upper electrode 122, which is made of an $n^+$ polysilicon layer. A metal top electrode 124 is deposited on top of the upper electrode 122.

The U-shaped layer structure 118 to 122 may typically be formed in a pore having a diameter of 2 μm and a depth 102 of 20 to 30 μm. Typical capacitance densities per area are between 25 $nF/mm^2$ to 75 $nFmm^2$ are reached with a capacitor device according to FIG. 1.

FIG. 2 schematically shows a circuit configuration 200 with a prior-art trench capacitor device 202 used as a bypass capacitor between a signal line and ground potential. The trench capacitor structure 100 of FIG. 1 is suitable for use in the capacitor device 202 due to its large capacitance. However, for use as a bypass capacitor in the present circuit configuration, a ground contact must be provided on the bottom side 116 of substrate 102, which is labeled by reference number 206 in FIG. 2. The ground contact 206 is connected to ground potential. Capacitor device 202 further has a contact structure 204 with two ports 204.1 and 204.2 for signal input and output, which are connectable to a signal line (not shown). Theoretically, if the capacitor device 200 could provide a perfect short circuit to ground, a signal wave entering at port 1 204.1 would fully be reflected. Therefore, port 2 204.2 would perfectly be decoupled from port 1 204.1.

However, the performance of known trench capacitors is dependent on frequency and far from providing a perfect short circuit to ground in the circuit configuration of FIG. 2. This will be explained in the following with reference FIG. 3. FIG. 3 is a diagram showing the dependence of the $S_{21}$ transmission coefficient of a prior-art trench capacitor as a function of frequency. The frequency is plotted in Hertz (Hz) on a logarithmic scale. The transmission coefficient $S_{21}$ is given in units of dB. Three measured curves are shown for three different trench capacitors having capacitances of 2.2 nF, 22 nF, and 380 nF, respectively. All three curves show a decrease of the transmission coefficient $S_{21}$ in a frequency range between 1 MHz and about 50 MHz (labeled "Range I"). A resonance effect in the shown transmission characteristics is seen for each curve, occurring between 100 MHz and 1 GHz, depending on the capacitance value.

The shown frequency dependence is due to the self-inductance of the trench capacitor. At the self-resonance frequency, the capacitance C and the self-inductance $L_{self}$ of the trench capacitor are in resonance. Here the operation of the capacitor is best, e.g. maximum signal suppression occurs, although the suppression in the range of GHz is still much better than with discrete SMD placed capacitors.

Table 1 below shows a comparison of surface area, capacitance, C, resistance, R, and self-inductance, $L_{self}$ values for several prior-art trench capacitors.

TABLE 1

Comparison of surface area, capacitance, resistance, and self-inductance values for several prior-art trench capacitors in an $n^-$-substrate

| Capacitor Surface [$mm^2$] | C [nF] | R [mΩ] | $L_{self}$ [pH] |
|---|---|---|---|
| 0.102 | 2.2 | 159 | 56 |
| 0.384 | 8.5 | 80 | 25 |
| 1.04 | 22 | 48 | 22 |
| 3.50 | 80.5 | 26 | 11 |
| 9.12 | 213 | 16 | 8 |
| 19.1 | 380 | 9 | 4 |

Industrially, the contact to ground is however present at the front side. In order to provide a network of capacitors and inductors, it is necessary to use a high-ohmic substrate, with a substrate resistivity in the order of 1 kΩcm or more. A current-path through the substrate to the bottom side 116 would have a far larger resistance, and thus a less adequate self-inductance.

However, there is currently a trend towards broadband applications. This is for instance the result of the UMTS protocol, which has a broader bandwidth than GSM. It is also encouraged by the IEEE 802.16 protocol. Additionally, the number of bands increases, particularly above 2 GHz, i.e. for Bluetooth, W-LAN and other wireless standards. For such broadband applications, there is a need that the self-inductance is low. Evidently, the broadband generally includes a portion above the resonance frequency ("Range II"). Here, the signal suppression between port 1 204.1 and port 2 204.2 is less efficient and a significant amount of the incident wave is transmitted to port 2. The higher the self-inductance, the less efficient the signal suppression. Also, the trench capacitor with the contact to ground at the front side is not adequate, as the path to ground tends to be long.

SUMMARY

This description describes a capacitor device that provides a good signal suppression over a broad range of frequencies when used as a bypass capacitor between a signal line and ground potential.

This description also describes a method for forming a capacitor device that provides a good signal suppression over a broad range of frequencies when used as a bypass capacitor between a signal line and ground potential.

According to a first example, a capacitor device is provided, comprising a substrate, the substrate having a first substrate side and an opposite second substrate side. The capacitor device further has a first and a second contact structure, of which the second contact structure is present on the second substrate side. A capacitor region of the capacitor device is embedded in the substrate and comprises at least one layer structure having a first and a second capacitor electrode electrically isolated from each other and having a U-shaped cross-sectional profile in a plane perpendicular to the first and second substrate sides. The first and the second capacitor electrode are electrically connected to the first and second contact structure respectively.

In the described capacitor device, a current-path region extends from one of the capacitor electrodes to the respective contact structure. The current-path region is configured to provide a path for an electrical current.

Moreover, the substrate comprises a recess on the first substrate side in a lateral substrate portion containing the capacitor region, the recess having a bottom face with a contact element that is part of the first contact structure, so that the capacitor region and the current-path region are arranged between the contact element and the second contact structure.

The capacitor device has the advantage of exhibiting a reduced impedance in the current-path region. This reduced impedance implies a low self-inductance that is caused by the current-path region of the capacitor device. The low self-inductance provides an improved signal suppression over a broadened spectral range, for instance in a circuit configuration that employs the capacitor device as a bypass capacitor between a signal line and ground potential.

The capacitor device thereto is effectively a modification of the non-industrialized structure as discussed by Roozeboom et al. in the IMAPS article. In order to improve its broadband properties, the substrate is provided with a recess, so that the effective current-path region is shortened. Importantly, the presence of the recess does not affect the handling of the substrate negatively. This is a relevant requirement as handling of the substrate is needed, particularly when it is use in a stacked configuration with further electrical devices, such as power amplifiers, integrated circuits, impedance matching networks and filters.

In comparison with the industrialized structure in which the first contact structure is also present at the second substrate side, the device has the advantage that path to the first contact structure, in particular to ground, is shortened. Additionally, it is straight and direct, which prevents the generation of parasitic inductive and capacitive interactions.

An advantage of the disclosed device is that it allows the use of a capacitor device with a relatively small capacitance for broadband applications. In the prior art, use of the largest capacitance value was necessary in order to arrive at a self-inductance sufficiently low for use in broadband applications. However, actually, such a large capacitance value is not needed in itself, as the impedance is already very low at high frequencies that constitute a major portion of the needed broadband. The use of such large capacitor is evidently commercially disadvantages, as a larger capacitor requires more surface area and is thus more expensive than a smaller one. For instance, a trench capacitor with a capacitance of 380 nF is very large and typically requires about 20 mm$^2$ of wafer area. Compared to the 2.2 nF capacitor with a capacitor surface of 0.102 mm$^2$, this is an increase of cost by a factor of about 200.

The structure of the disclosed capacitor device is thus based on the general perception that the self-inductance and resistance of the capacitor is dominated by the current path through the substrate. The current-path region is located between the first electrode, which is electrically connected to the current path region, and the first contact structure. The length of the current path is strongly reduced in comparison to known capacitor device structures due to the short distance spanned by the current path region. As will be shown later on with respect to FIG. 15, for a given capacitor area, the inductance of the capacitor is reduced for a thinner substrate due to two reasons: a) the inductance per length is reduced due to a smaller aspect ratio of the capacitor, given by the quotient of capacitor diameter over substrate thickness, and b) the total current path length is reduced.

Preferably the length of the current-path region is at most 50 microns. More preferably it is in the same order as the length of the capacitor region. Most suitably, the total thickness of the substrate in the recessed lateral region is 50 microns or less. This constitutes a major improvement to the structure of the mentioned article, wherein the current-path region is in the order of 350 microns. In this range, the aspect ratio is such that the self-inductance is less than 4 pH, as was previously obtained only for a capacitor of 380 nF, even for very small capacitances, in the order of 2 nF. Small capacitors may thus be used effectively for signal suppression above the resonance frequency, and are therewith very suitable as bypass capacitor for broadband signal suppression.

In the following, preferred embodiments of the capacitor device will be described. Unless it is explicitly stated that different embodiments form alternative ways of executing the described device, it is understood that the additional features of the embodiments described in the following can be combined with each other.

In one preferred embodiment, the first contact structure is provided with at least two signal ports electrically connected with each other, one operating as input and the other as output, while the second contact structure is a ground connection. The connection of the signal ports of the first contact structure through the contact element on the bottom face of the recess implies that there can be a larger inductance in the contact structure. This is caused by the required connection lines between the signal ports and the contact element on the bottom face of the recess. However, it is to be noted that the self-inductance of the capacitive structure itself is very small, which is decisive for the broadening of the usable frequency range of the capacitor device for signal suppression. The relatively large inductance of the contact structure does not play a role for that.

This preferred embodiment is substantially different from the prior art structure by Roozeboom et al., wherein the signal ports are present at the substrate side near to the capacitor region and the ground connection is present at the substrate side remote from the capacitor region. This modification has an impact on the device configuration in a stacked die assembly in a first embodiment. In this first embodiment, as will be discussed later, the trench capacitors have their apertures on the second side of the substrate. The ground connection is also present on this side. The ground connection is preferably directly connected to a carrier, such as a laminate, leadframe of printed circuit. The capacitors are thus present at the side facing the carrier.

For the assembly of further devices, two major options are considered: either on the first side or on the second side. If the further devices are assembled to the second side, the contact structures corresponding to the signal ports are rerouted from the first to the second side. This may be achieved with through substrate contact vias of other contact lines.

If the further devices are assembled to the first side, such through substrate contact vias may be present in the capacitor device for the coupling of the further device to the carrier, instead of the use of bond wires or the like. The first side may then be used not only for the definition of contact structures, but also for other elements, such as inductors and the like. As the conductors on the first side may have relatively large dimensions, and that an inductor may be properly integrated therein. These may even be manufactured without photolithography, in that merely a screenprinted mask is provided on this first side and the conductors are thereafter provided by a known technique such as sputtering, electroplating or the like.

Preferably, the side faces of the recess are inclined by an angle of more than 90° with respect to the bottom face of the recess in a first recess section between the contact element and =recessed portions of the first substrate side. In a second recessed section, the side faces of the recess preferably are at an angle of 90° with respect to the bottom face of the recess. This latter section is filled the contact element. With the structure of this embodiment it is possible to further reduce the distance between the contact element on the bottom face of the recess and the contact structure on the second substrate side. Therefore, the resistivity and self-inductance of the capacitor device can be even further reduced.

In the following, alternative embodiments will be described, in which with the capacitor region is formed underneath the recess.

In a first alternative embodiment, the current-path region is formed by a conductive substrate region that is arranged between the bottom face of the recess on the first substrate side and the capacitor region. In the cross-sectional profile view mentioned before, a bottom of the U-shape points towards the bottom face of the recess. That means, in this cross-sectional view, showing the second substrate side as the bottom side and the first substrate side as the top side of the substrate, the trenches of the capacitors have the shape of an inverted U. The bottom of the "U" thus is separated from the bottom face of the recess by the current-path region. In this first alternative embodiment, the trench capacitors are manufactured from the second substrate side.

It is noted that variations from an exact U-shape of the trench cross-sectional profile are possible. A rectangular shape resembling a U or a shape that resembles a "V" form viable alternatives, that shall be comprised when speaking of a U-shape. Other variations include side faces of the trenches that deviate from an exact straight line in the cross sectional view. For instance, a side face of a trench can have a recess in a lateral direction. This type of variations shall also be comprised when speaking of a U-shape.

The conductive substrate region is preferably a low-resistivity region of the substrate. Low resistivity is a prerequisite for achieving a low-resistance current-path region. If the whole substrate has a low resistivity, no particular measures are required with respect to providing a low-resistivity of the current-path region. However, if the substrate is a high-resistivity substrate, the current-path region is preferably doped with a suitable dopant at a suitable concentration, in order to obtain a low-resistivity current-path region. Low-resistivity refers to resistivity values between a few Milliohm*cm and a few Ohm*cm. High resistivity values typically range between one and several Kiloohm*cm.

In a variation forming an alternative to the previous embodiment, the current-path region is formed by a passivation layer covering the bottom face of the recess and being covered by the contact element. The passivation layer is thus arranged between the capacitor region and the contact element, similar to the previous embodiment. However, instead of substrate material, a passivation layer is used for the current-path region. While a passivation layer typically is formed by silicon dioxide, and silicon dioxide is an insulating material, a high frequency current-path with a small resistivity can be formed employing a small-enough thickness of the passivation layer. A thickness of about 10 nm is suitable for this purpose. This embodiment can for instance be realized by either using trenches with a particularly long depth of more than 30 μm, or by thinning the substrate to a particularly low thickness value in the recess, for instance 25 to 40 μm, which is then equal to the sum of the pore length and the passivation layer thickness.

In a second alternative embodiment that employs a recess in the substrate material, the current-path region is arranged between the capacitor region and the second contact structure on the second substrate side. In this embodiment in the cross-sectional profile, the bottom of the U-shape points towards the second substrate side.

Unlike the preceding alternative embodiment and its variations, the present embodiment uses trench capacitors formed from the first substrate side, namely, at the bottom of the recess. Referring again to the orientation of the substrate with respect to top and bottom in the cross-sectional view defined earlier, each trench forms an upright "U" in the substrate. The current-path region is thus arranged between the trench-capacitor bottom and the bottom side of the substrate.

It is noted that the formation of the trench capacitors by etching is more complicated in this embodiment, since standard etch processes cannot be applied here when forming the trenches at the bottom of the recess. However, the advantage of the present embodiment is that all processing can be done from the first substrate side, which, as mentioned before, typically forms the top side of the substrate that, e.g., in an IC, also contains other circuitry.

In a variation of this embodiment, similar to a variation of the embodiment using an "inverted-U" trench structure, the current-path region is formed by a passivation layer. The passivation layer is arranged between the bottom of the trenches and the second contact structure on the second substrate side. This variation is similar to that described for the earlier embodiment employing an inverted "U" trench arrangement underneath the recess.

In the following, alternative embodiments providing different ways of arranging the contact structures allowing different forms of packaging will be described.

In one embodiment the signal ports of the first contact structure are arranged on the second substrate side. The signal ports are connected to the contact element on the bottom face of the recess through contact lines extending along third and fourth sides of the substrate, which are perpendicular the first and second substrate sides. The present embodiment is particularly suitable for a packaged ultra-low-impedance trench capacitor forming a stand-alone-component.

The device of this embodiment has its signal ports and the second contact structure on the same (second, or bottom) substrate side. This makes a packaging of the capacitor easier because it can be contacted on a single substrate side. One packaging alternative is for instance achieved by mounting the capacitor device to a carrier substrate. In fact, however, the capacitor device of the present embodiment can be mounted to different kinds of carriers, thus enlarging the availability of this capacitor structure in different system-in-package technologies. For instance, the capacitor device could be mounted onto a radio frequency (RF) laminate, or onto an Low-Temperature Cofired Ceramics (LTCC) carrier substrate, or an IC-wafer.

An alternative way of providing signal ports on the second or bottom substrate side is to connect the signal ports to the contact element on the bottom face of the recess through contact lines by means of through-substrate contact vias extending through the substrate from the first substrate side to the second substrate side in unrecessed substrate portions. This embodiment is preferably used in a processing scheme, in which the trench capacitor is formed on the second substrate side. The second substrate side of the capacitor device of this embodiment can be used as the processing substrate side during manufacture of the device. However, for packaging of the capacitor device in a SiP, the processing, or second substrate side is used as the bottom side when mounting the device on a carrier substrate.

Another alternative embodiment places the signal ports of the first contact structure on the first (or top) substrate side in unrecessed substrate portion. In this embodiment, in contrast to the previous two embodiments, the first and second contact structures are placed on different substrate sides. Similar to the other arrangement using signal ports on the second substrate side, however, the signal ports are connected to the contact element on the bottom face of the recess.

According to a second example, an electronic circuit is provided, which comprises a capacitor device according to the first example or according to one of the described embodiments of that capacitor device. In the electronic circuit of the second example, the capacitor device is coupled in parallel between a signal line and a ground contact. The capacitor device is connected to the signal line through the first contact structure and to the ground contact through the second contact structure.

The electronic circuit achieves an enhanced signal suppression over a very broad frequency range, which is due to the advantages provided by the capacitor device of the first example.

The electronic circuit provides a generic function, which is required for radio frequency front-end modules. For instance, the electronic circuit can be an amplifier circuit for radio frequency signals according to GSM (Global System of Mobile Communication), Bluetooth or WLAN (Wireless Local Area Network) standards. For emerging higher-frequency applications like 12 GHz satellite communication or 24 GHz or 77 GHz car-radar, the electronic circuit can provide a broad-band millimeter-wave bypass function. As grounding and bypassing is essential and very complicated to achieve at wave-wave frequencies, the electronic circuit is a crucial component in extending design and processing capabilities to the wave-wave frequency range.

According to a third example an electronic component is provided. The electronic component comprises a carrier substrate and, fixed to the carrier substrate a capacitor device according to the first example or according to one of the embodiments of the capacitor device of the first example. The electronic component of the third example incorporates the advantages of the capacitor device of the first example and of the electronic circuit of the second example.

In one embodiment of the electronic component, an integrated circuit is arranged between the carrier substrate and the capacitor device. The integrated circuit has signal ports that are electrically coupled to the first and second signal ports of the first contact structure of the capacitor device, which in this embodiment provides the signal ports on the second substrate side of the capacitor device. Preferably, the capacitor device is provided in an embodiment with through-substrate contact vias, as described before.

According to a fourth example, a method for manufacturing a capacitor device is provided. The method comprises the steps of providing a substrate having a first substrate side and an opposite second substrate side, thinning the substrate from an original substrate thickness down to a reduced substrate thickness in a lateral substrate portion containing the capacitor region, forming a capacitor region embedded in the predetermined lateral portion of the substrate by producing at least one layer structure having a first and a second capacitor electrodes isolated from each other and having a U-shaped cross-sectional profile in a plane perpendicular to the first and second substrate sides, forming a first contact structure and forming a second contact structure, providing a current-path region in the thinned lateral portion of the substrate and thereby electrically coupling a predetermined one of the capacitor electrodes to the respective contact structure.

DRAWINGS

In the following, further embodiments will be described with respect to the Figures.

DETAILED DESCRIPTION

Figure 4:
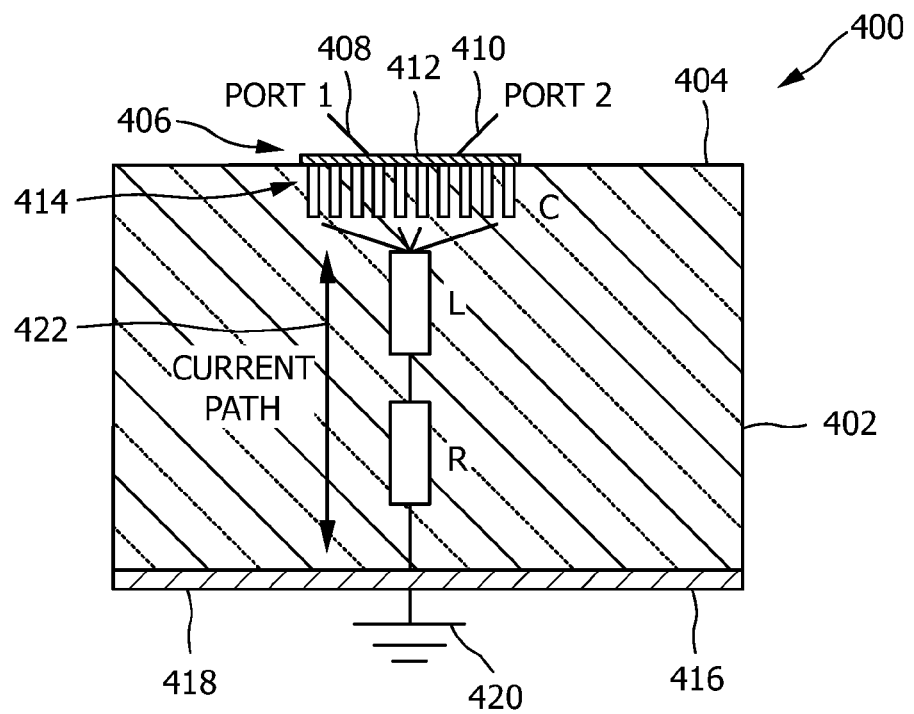
FIG. 4 is a schematic diagram of a capacitor device according to the prior art.

FIG. 4 is a schematic diagram of a capacitor device 400 according to the prior art. Capacitor device 400 is made in a low-resistivity silicon substrate 402. On a first substrate side 404, which forms the top side according to the view of FIG. 4 a signal contact structure 406 is provided with an input port 408, an output port 410 and a contact element 412. The contact element is a metal electrode, which is connected with electrode layers of a number of trench capacitors in a capacitor region 414. The trench capacitors are only shown schematically as a number of rectangles in the present figure.

On a second substrate side, which forms the bottom substrate side 416 in the view of FIG. 4, a second contact structure is provided, which is connected to ground potential 420.

The prior art capacitor device of FIG. 4, when used as bypass capacitor between a signal line connected to port 1 408 and port 410 on one side, and ground potential 420 on the other side, exhibits a transmission performance that is determined by the impedance and self-inductance of the capacitor device 400. The value of the impedance is determined by the length of the current path between the capacitor range 414 and the ground contact 418. Given a typical trench depth in the substrate 402 of 20 to 30 µm and a typical substrate thickness of between 200 and 500 µm, the current path region amounts to at least 150 µm and can amount to even 450 depending on the substrate thickness. Thus, current-path region 422 of the prior-art capacitor device 400 is quite long and results in a high self-inductance, as explained earlier.

Figure 5:
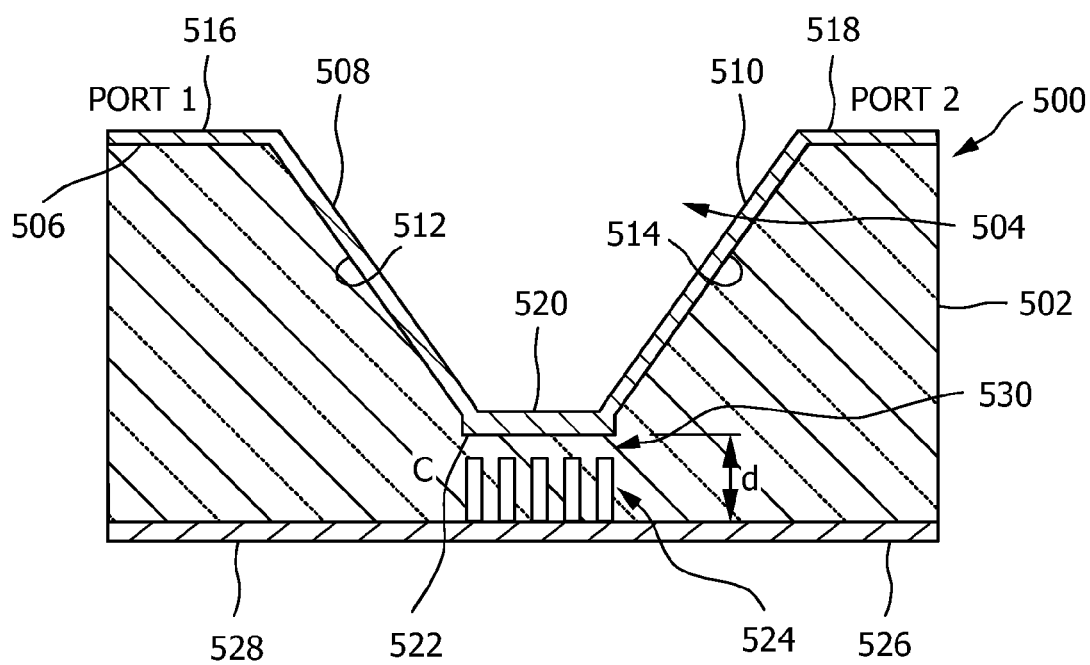
FIG. 5 shows a simplified and schematic cross-sectional view of a first embodiment of a capacitor device as disclosed herein.

FIG. 5 shows a simplified and schematic cross-sectional view of a first embodiment of a capacitor device 500 disclosed herein. In a low-resistivity silicon substrate 502, a recess 504 is formed. The recess can for instance be produced by micromachining from the top side 506 of the substrate 502. As can be seen in the top view of capacitor device 500 in FIG. 6, contact lines 508 and 510 are provided on two side faces 512 and 514, respectively. Contact lines 508 and 510 connect input port (or more generally speaking: port 1) 516 with output port (or more generally port 2) 518 through a contact element 520. Contact element 520 takes the form of a metal plate at the bottom of the recess 504. In fact, the connection lines 508 and 510 are located on the side faces 512 and 514 of a cavity while the contact element 520 is arranged on the bottom face 522 of recess 504. Input and output ports 516, 518, contact lines 508, 510 and contact element 520 form a first contact structure.

The recess 504 reduces the thickness of the substrate underneath the bottom face 522 (and contact element 520) compared to the original substrate thickness, which can be seen in the unrecessed portions, for instance at port 1 516. The reduced thickness in comparison to the unrecessed portions is indicated by double arrow d. The thickness d is in the range up to 50 µm.

Figure 1:
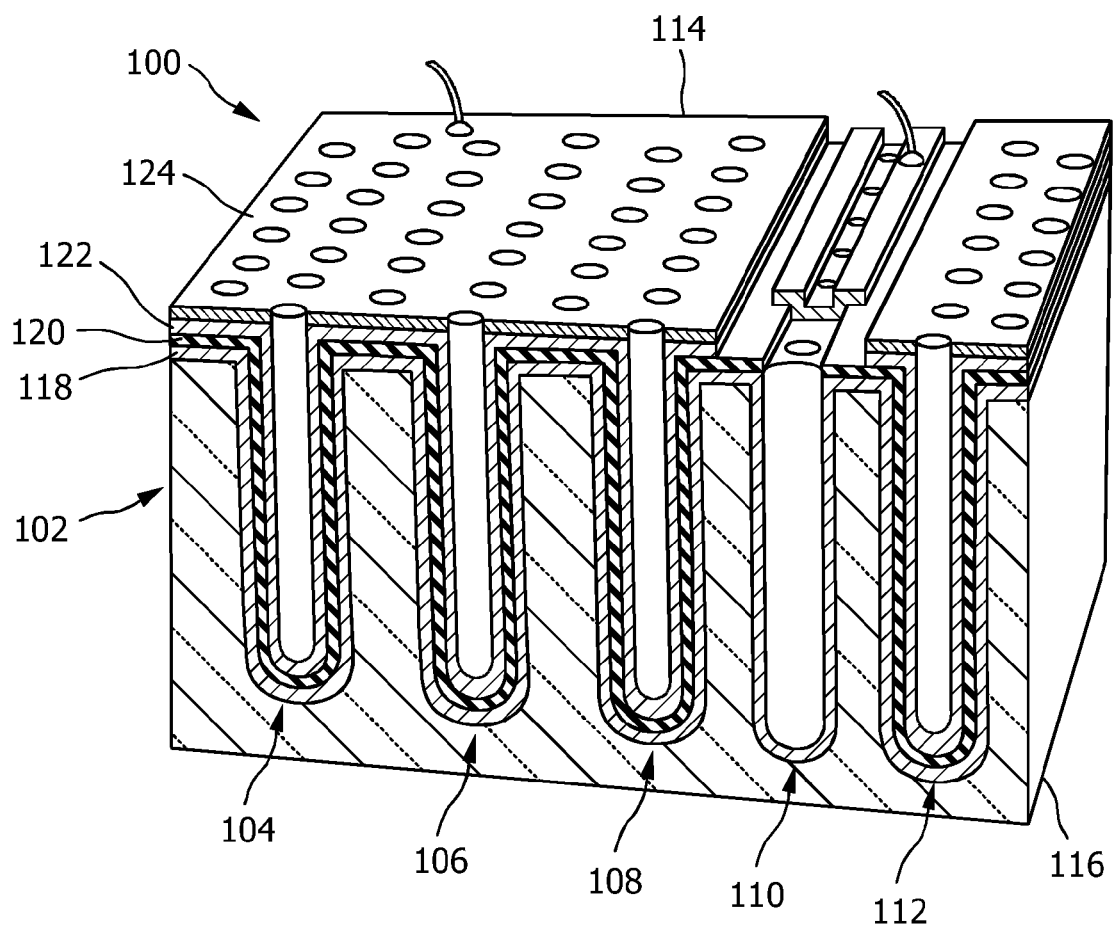
FIG. 1 is a schematic three-dimensional and cross-sectional view of a trench capacitor according to the prior art.

A capacitor region 524 is formed by an array of trench capacitors, such as those described with reference to FIG. 1. However, in the present capacitor device 500, the trenches are formed from the bottom substrate side 526. The trench capacitors each contain a layer structure with two conductive layers isolated from each other and having the shape of an inverted U in the view of FIG. 5. Corresponding conductive layers of the trenches are connected to form a respective capacitor electrode. The electrodes are isolated by an insulation layer, such as a ONO layer (oxide-nitride-oxide layer stack).

One of the capacitor electrodes is connected to a ground contact 528. The ground 528 is a metal plating provided on the bottom side 526, and can be connected to a ground potential in a circuit configuration corresponding to that shown in FIG. 2.

The second electrode (not shown) of the trench capacitors is connected to contact element 520 through a current-path region 530. The second electrode is formed by a conductive trench layer that is deposited closest to contact element 520. Current-path region 530 therefore bridges the distance between that electrode an contact element 520 on the bottom face of recess 504. In the present embodiment, the length of the current-path region between the trench electrode layer and the contact element 520 amounts to approximately 15 µm.

Figure 2:
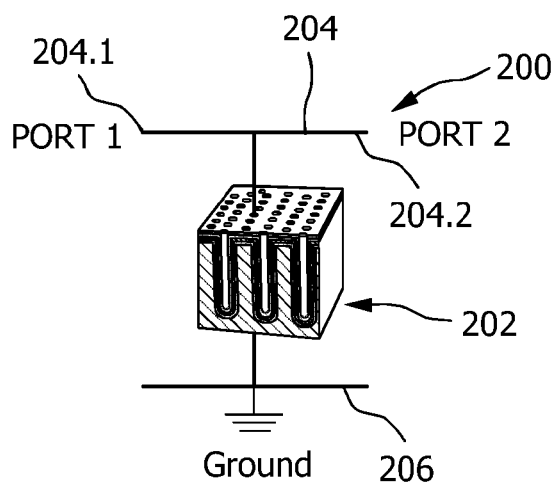
FIG. 2 is a schematic diagram of a capacitor device used as bypass capacitor between a signal line and ground potential, employing a trench capacitor according to the prior art.
Figure 3:
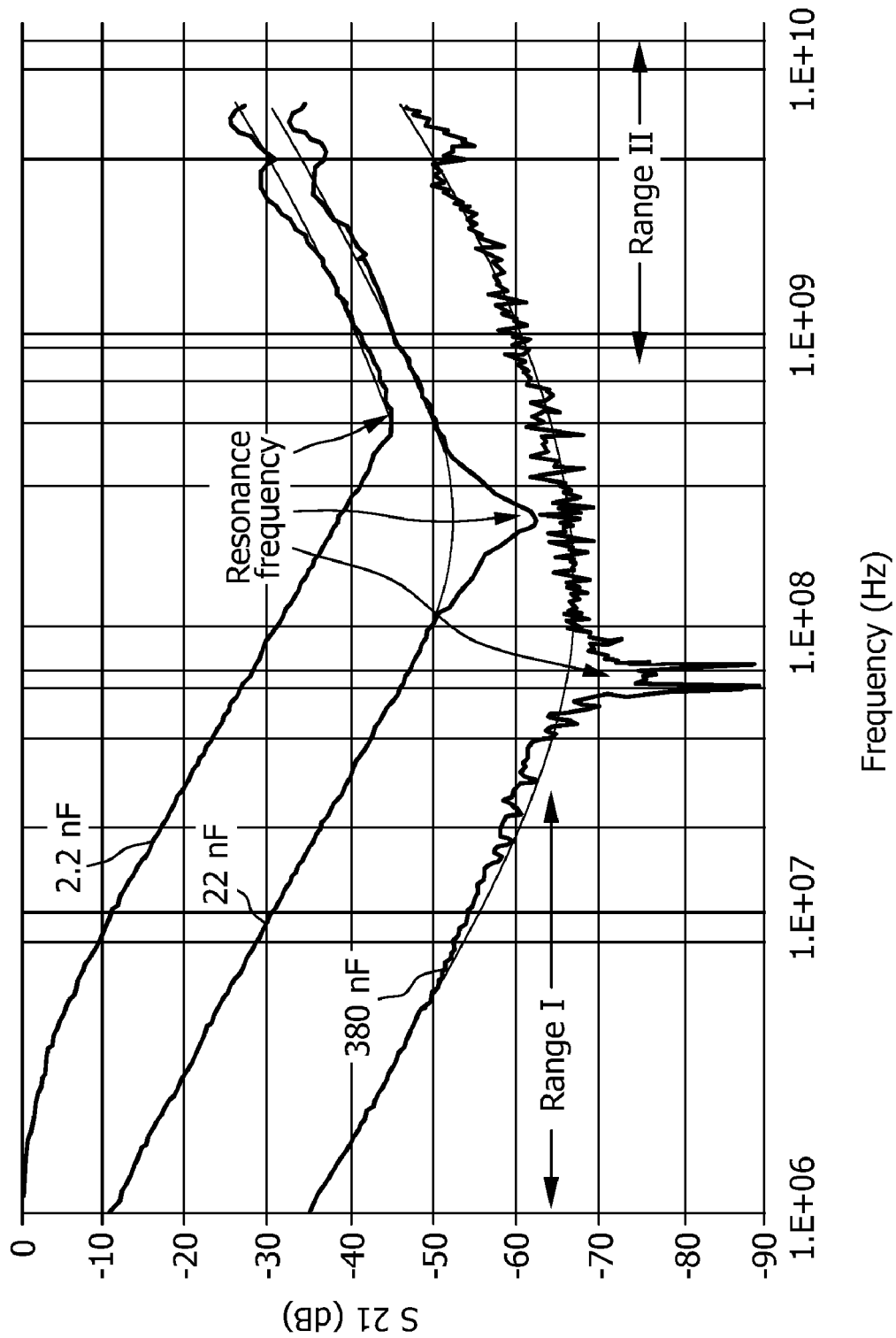
FIG. 3 shows a diagram that depicts the frequency dependence of the $S_{21}$ transmission coefficient of a signal wave incident at port 1 and transmitted to port 2 in the circuit configuration of FIG. 2
Figure 6:
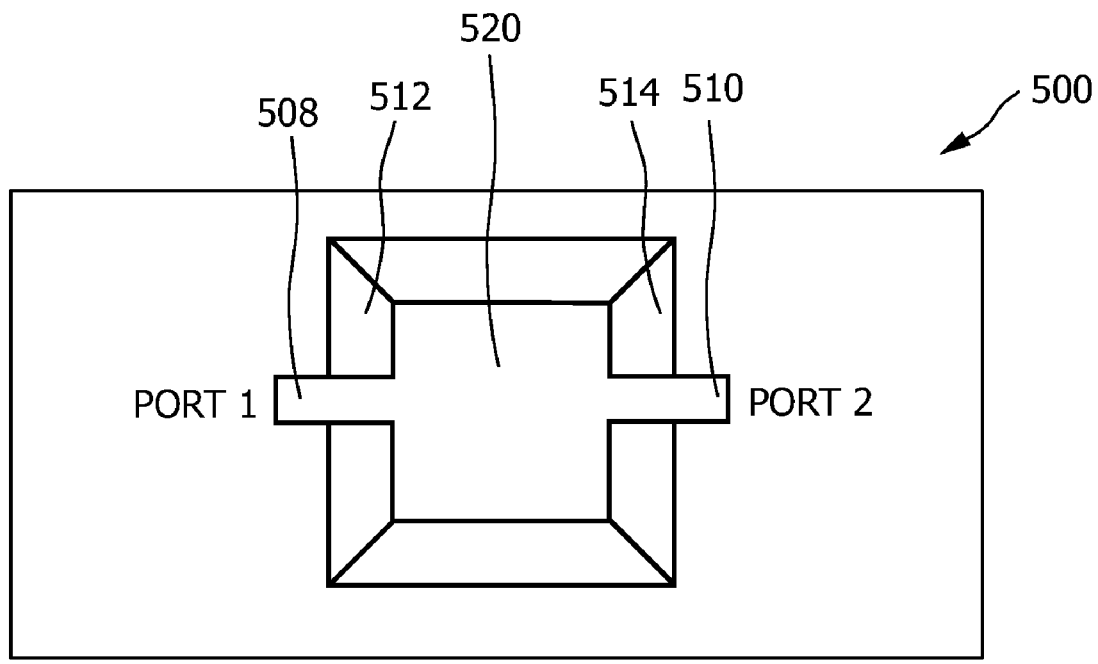
FIG. 6 is a schematic top view of the capacitor device of FIG. 5.
Figure 7:
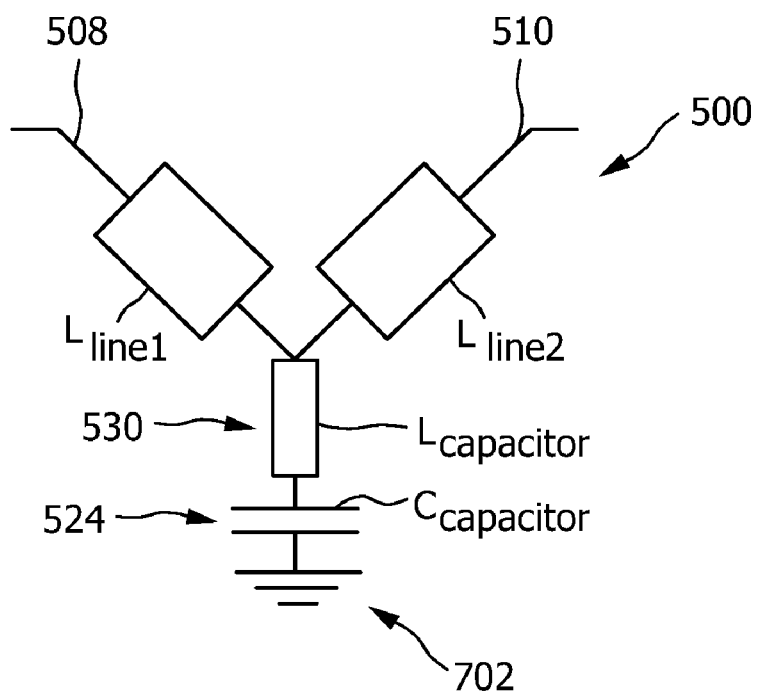
FIG. 7 is an equivalent circuit diagram of the capacitor device of FIGS. 5 and 6.

The advantages of the capacitor device 500 will next be explained with reference to FIG. 7. FIG. 7 is an equivalent circuit diagram of the capacitor device of FIGS. 5 and 6. FIG. 7 represents an equivalent diagram of a circuit configuration as shown in FIG. 2, but using capacitor device 500 instead of capacitor device 200. The capacitor device 500 is connected to ground potential 702. In the equivalent circuit diagram of FIG. 7, the inductance of connection lines 510 and 512 is represented by respective symbols labeled $L_{line1}$ and $L_{line2}$, respectively. The inductance $L_{capacitor}$ due to the current-path region 530 is represented by a corresponding symbol. The trench capacitor region 524 is represented by the capacitor symbol labeled $C_{capacitor}$. As can be seen by the equivalent circuit diagram, the input and output connection lines 508 and 510, respectively represent a certain inductance. So does the current path inside the silicon substrate 502 between the trench capacitor electrode layer and the contact element 520 on the bottom of the recess 504. The inductance $L_{capacitor}$ of the current-path region 530 is determined by this distance. And it is this inductance $L_{capacitor}$ in the path to ground that limits the performance of the capacitor, not the inductance of the lines $L_{line1}$ and $L_{line2}$. The capacitor layout of the capacitor device 500 thus chooses a small inductance of the capacitor by having a short current path in the substrate and longer connection lines to the capacitor. However, since the inductance of the capacitor itself is very small, the capacitor device 500 has a broader frequency range of use. Further details regarding the advantages of the capacitor device 500 and the embodiments explained in the following will be given below with reference to FIGS. 13 and 14.

Figure 8:
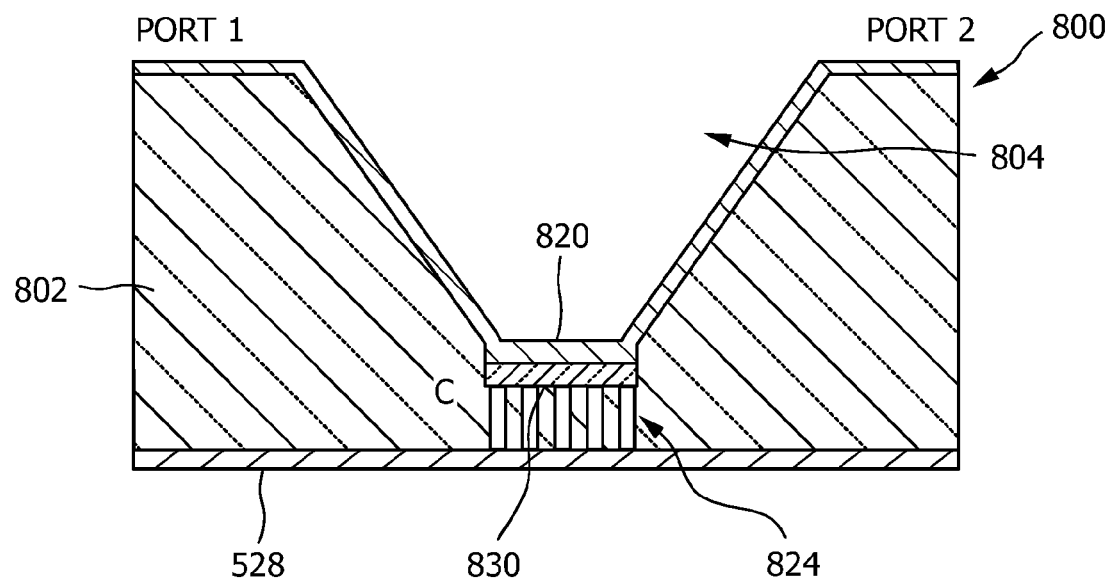
FIG. 8 is a simplified and schematic cross-sectional view of a second embodiment of the capacitor device disclosed herein.

FIG. 8 is a simplified and schematic cross-sectional view of a second embodiment of the capacitor device 800. The structure of capacitor device 800 very much resembles that of capacitor device 500 is shown in FIGS. 5 and 6 and will in the following only be explained with respect to its distinguishing features over that earlier embodiment. Unlike capacitor device 500, capacitor device 800 is made in a high-resistivity silicon substrate 802. Since the impedance and self-inductance of the current-path region 830 between the capacitor region 824 and the contact element 820 on the bottom of recess 804 should be as low as possible, current-path region 830 is doped in the present embodiment to achieve a low-resistivity current path. This way, the performance of capacitor device 800 is equally advantages as that of capacitor device 500, even though a high-resistivity substrate is used.

Figure 9:
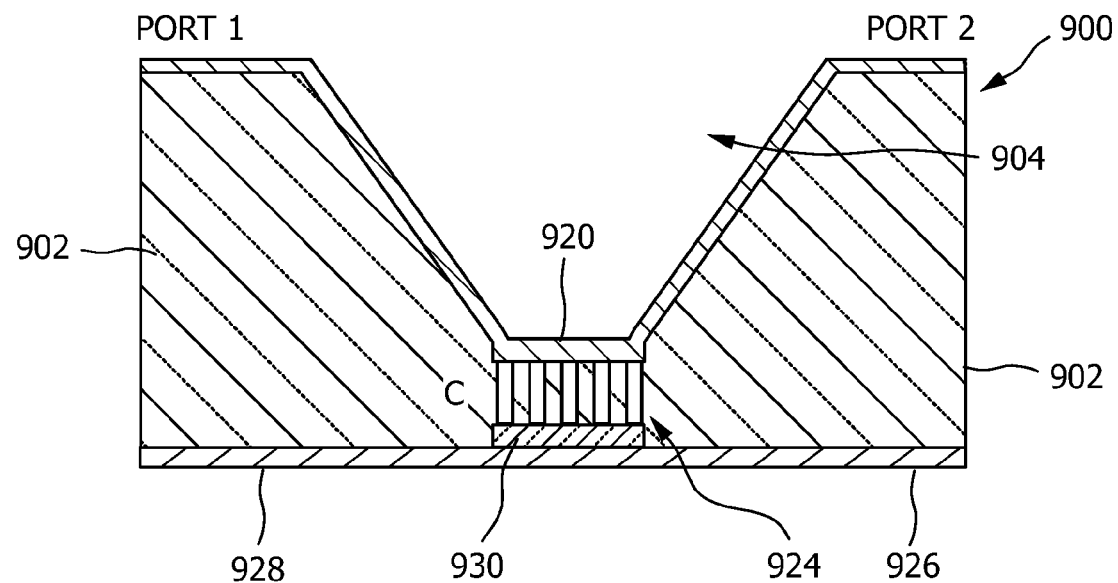
FIG. 9 is a simplified and schematic cross-sectional view of a third embodiment of the capacitor device disclosed herein.

FIG. 9 is a simplified and schematic cross-sectional view of a third embodiment of the capacitor device 900.

Again, the structure of capacitor device 900 very much resembles that of capacitor device 500. In the following only distinguishing features with respect to the capacitor device of FIGS. 5 and 6 will be described.

Similar to the embodiment of FIG. 8, the capacitor device 900 is made in a high-resistivity substrate 902. Furthermore, the arrangement of the capacitor region 924 and the current-path region 830 is reversed in order between contact element 920 and ground 928. That means, the trench capacitors of capacitor region 924 are formed from the bottom of recess 804 before the deposition of contact element 920. Therefore, the trenches of capacitor region 924 exhibit the shape of an upright "U" in this embodiment. Contact element 920 is connected to a first electrode layer formed in these trenches. Ground electrode 928 is connected to a second electrode layer of the trenches through current-path region 930. Current-path region 930 is, like in the embodiment of FIG. 8, a low-resistivity region, which is achieved by selective doping from the bottom side 926 of substrate 902.

In this embodiment, the etching of the trenches is more complicated, since a standard etch process with known contact masks can not be applied in this embodiment. However, the advantage of the present embodiment is, that all processing can be done from the top side of substrate 902.

Figure 10:
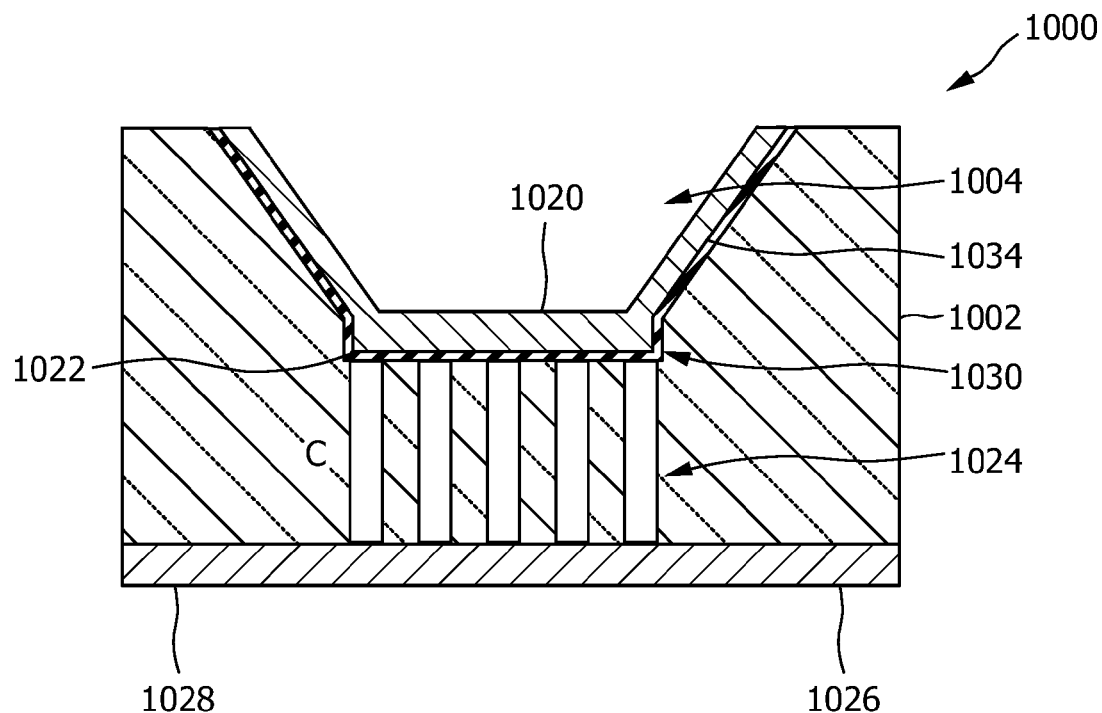
FIG. 10 is a simplified and schematic cross-sectional view of a portion of a fourth embodiment of the capacitor device disclosed herein.

FIG. 10 is a simplified and schematic cross-sectional view of a portion of a fourth embodiment of the capacitor device 1000. Similar to the previous embodiments shown in FIGS. 8 and 9, the following description will focus on structure elements distinguishing capacitor device 1000 from those of the previous embodiments.

In the present embodiment, the current-path region 1030 is formed by passivation layer 1034 deposited on the bottom face 1022 of recess 1004 before the formation of contact element 1020. Passivation layer 1034 is also deposited on the side faces of recess 1004.

Furthermore, in the present embodiment, the capacitor region 1024 is formed by trenches having an "inverted" U-shape in the view of FIG. 10. The trenches are thus formed from the bottom side 1028 of substrate 1002. This similar to the embodiments of FIGS. 5 and 8. However, the trenches of capacitor region 1024 extend in the substrate from the bottom to the passivation layer 1034 at the bottom of recess 1004. This way, the current path 1002 does not include any substrate material. This way, the length of the current path through the substrate is further reduced.

The passivation layer is typically made of silicon dioxide. The thickness of the passivation layer is in the range of 10 nm. The present embodiment can be realized in a low-resistivity or in a high-resistivity silicon substrate 1002.

In another embodiment, which is not shown, the arrangement of the passivation layer and the capacitor region between contact element 1020 and ground contact 1026 is inverted. In this embodiment, the passivation layer is formed on the bottom side 1028 of substrate 1002. The trenches are formed on the top side of substrate 1002 from the bottom face 1022 of recess 1004, before the deposition of contact element 1020.

The trench formation is done by etching and will stop, when the passivation layer 1034 is reached.

Figure 11:
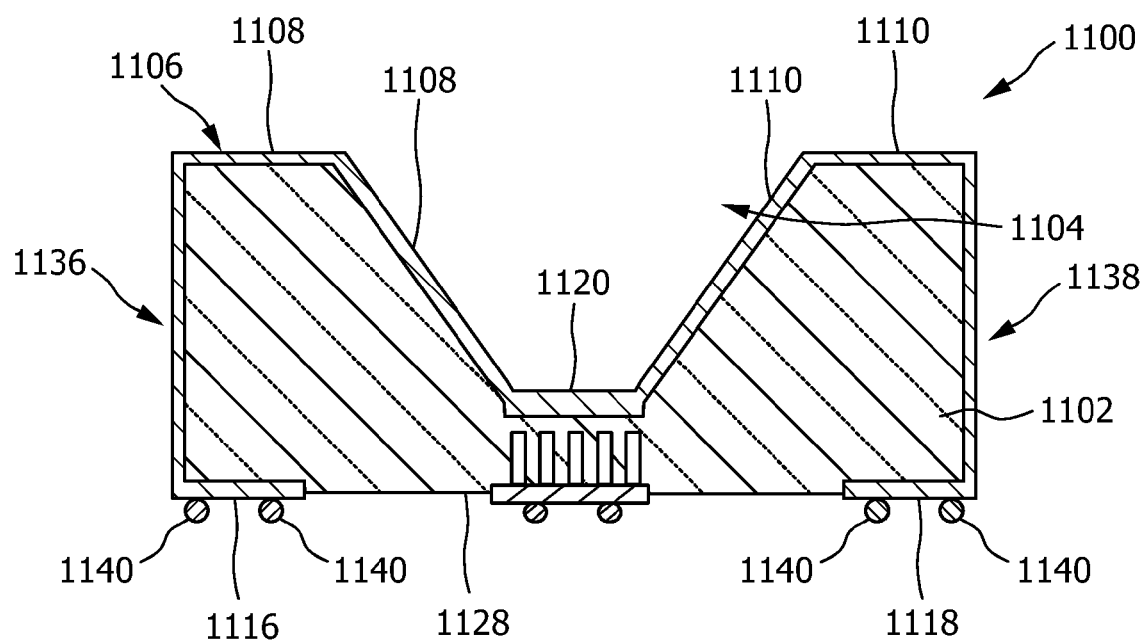
FIG. 11 is a simplified and schematic cross-sectional view of a fifth embodiment of the capacitor device disclosed herein.

FIG. 11 is a simplified and schematic cross-sectional view of a fifth embodiment of the capacitor device 1100. In this embodiment, capacitor 1100 forms a stand-alone component. The packaging of capacitor device 1100 is adapted to mounting the capacitor device on a carrier contacting bottom side 1128. Contact element 1120 at the bottom face of recess 1104 is connected to input port (or port 1) 1116 and output port (or port 2) 1118 via connection lines 1108 and 1110, respectively. However, unlike in the embodiment of FIG. 5, the connection lines 1108 and 1110 are routed along the top side 1106 and along the left and right sides 1136 and 1138, respectively, to their respective port structures 1116 and 1118. The signal ports 1116 and 1118 comprise flip-chip balls 1140 for mounting the capacitor device 1100 on a carrier substrate (not shown). The capacitor device 1100 has the advantage of being applicable in different SiP technologies. It could for example be mounted onto a RF laminate or an LTCC carrier substrate or an IC-wafer.

Figure 12:
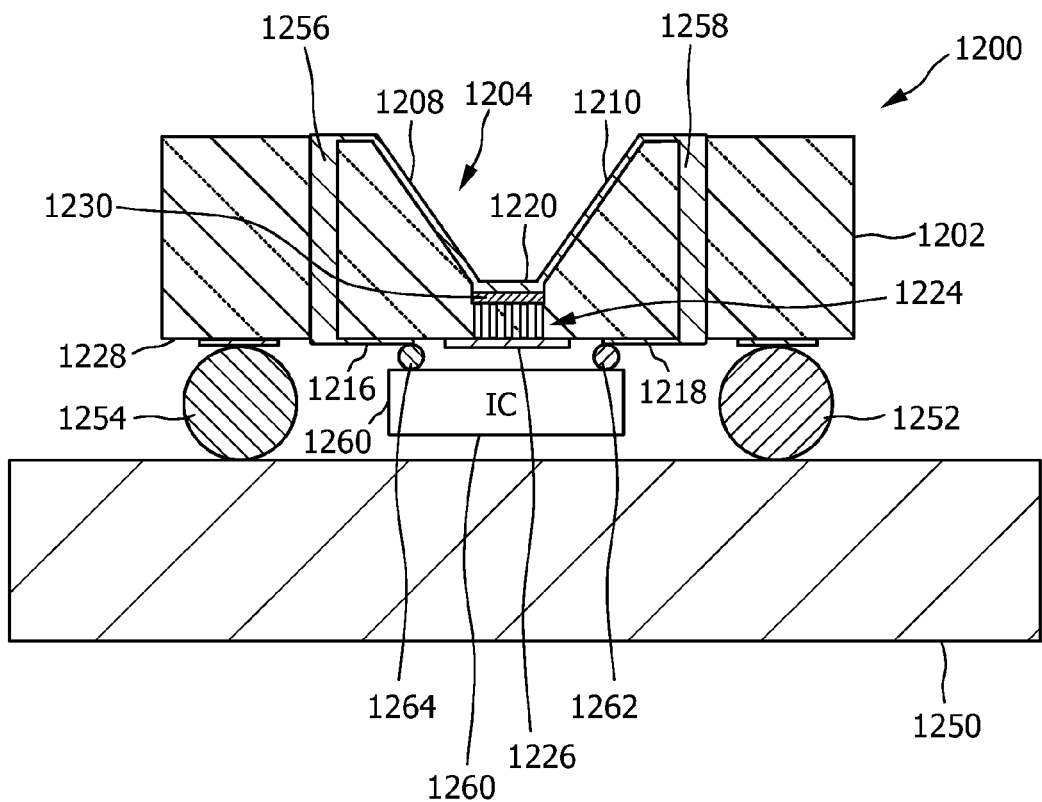
FIG. 12 is a schematic view of an electronic component comprising a sixth embodiment of a capacitor device disclosed herein.

FIG. 12 is a schematic view of an electronic component comprising a sixth embodiment of a capacitor device 1200. The packaging schema shown in FIG. 12 includes a capacitor device 1200 mounted on a carrier substrate 1250 using metal balls 1252 and 1254. The capacitor device differs from that shown in FIG. 11 by a routing of the connection lines 1208 and 1210 through vias 1256 and 1258, which extend through the complete substrate thickness in unrecessed substrate portions. The vias are electrically isolated from the surrounding substrate, but filled with a metal to provide electrical connection between the contact element 1220 and signal ports 1216 and 1218 on the bottom side 1228 of substrate 1202.

By providing metal balls 1252 and 1254 with an appropriate size, there is enough room between carrier substrate 1250 and capacitor device 1200 to provide an integrated circuit 1260 between the top side of carrier substrate 1250 and the bottom side 1228 of capacitor device 1200. A connection between the signal ports 1216 and 1218 of capacitor device 1200 and signal ports on integrated circuit 1260 is accomplished by metal balls 1262 and 1264. Ground contact 1226 is electrically connected to the ground reference of the carrier substrate.

Figure 13:
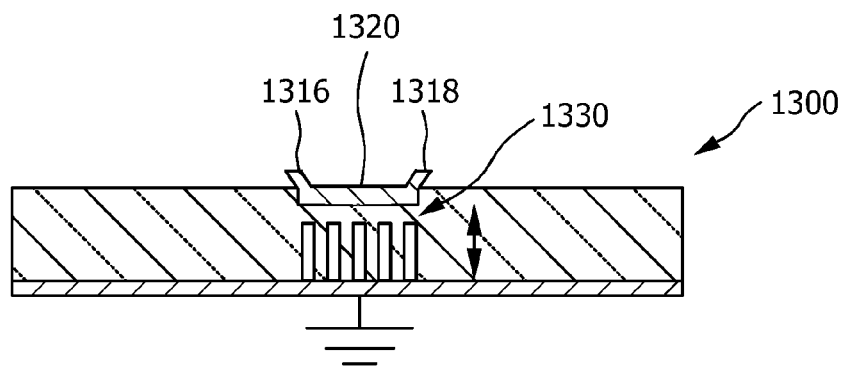
FIG. 13 is a schematic view of a seventh embodiment of a capacitor device disclosed herein.

FIG. 13 is a schematic view of a seventh embodiment of a capacitor device 1300. The capacitor device 1300 of FIG. 13 differs from the embodiments of FIGS. 5 through 12 in that the complete substrate is thinned down from an original substrate thickness of typically 200 to 500 μm to a reduced substrate thickness of about 50 μm. Signal ports 1316 and 1318, which are connected to contact element 1320 can be made as simple wire contacts.

Other than that, the present embodiment resembles that of FIG. 5. However, the alternative configurations of FIGS. 8 through 10 for the formation of the capacitor and current-path regions could be used in this type of capacitor device as well.

Figure 14:
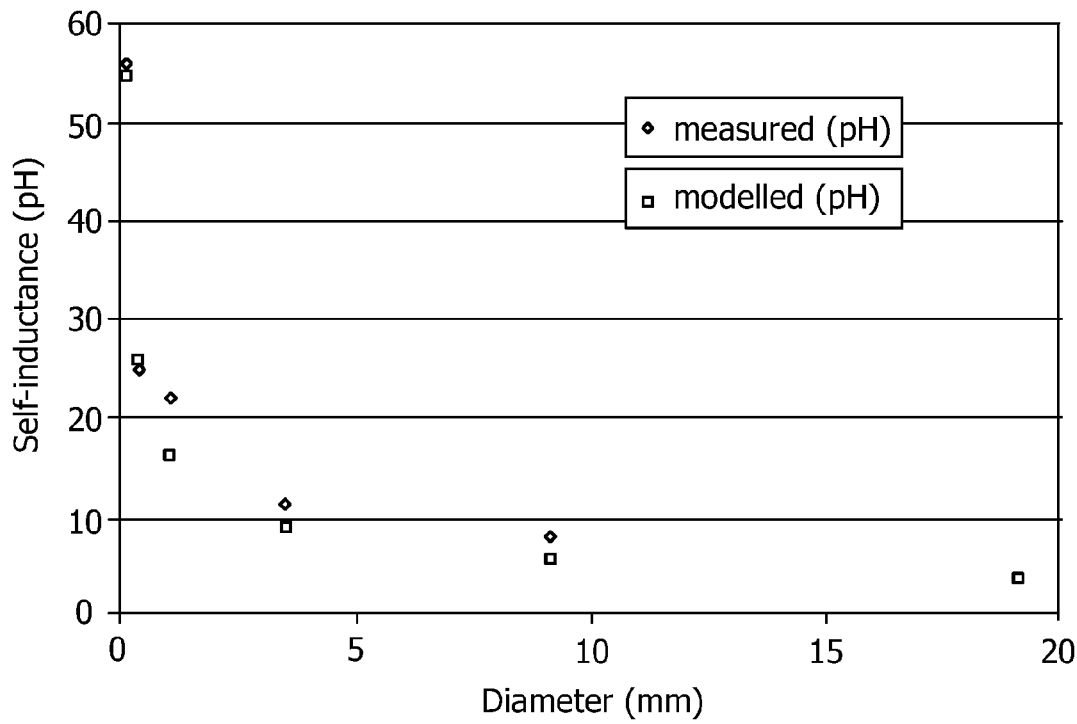
FIG. 14 is a diagram showing a comparison between measured self-inductance of trench capacitors and an analytical estimation of the self-inductance for prior-art capacitors according to FIG. 1.

FIG. 14 is a diagram showing a comparison between the measured self-inductance of trench capacitor devices and an analytical estimation of the self-inductance of a prior-art capacitor, as a function of the diameter of the capacitor region in a trench capacitor device. The parameter "diameter" implies the assumption that the capacitor device has a capacitor region consisting of a circular arrangement of a number of pores with a given distance between each other. This diameter thus refers to the overall side-length of the capacitor region, not just of one pore. The pores are typically about 2 micrometer in diameter, but typically thousands of them are placed next to each other.

In FIG. 14, measured self-inductance values are indicated by diamonds, and calculated sel-inductance values are indicated by squares. The calculation was performed according to the following equation, which gives the inductance $L_{capacitor}$ of a capacitor to ground in low-resistive silicon:

$$L_{capacitor} = h_{Substrate} \cdot \kappa(A) \qquad (2)$$

$$\kappa(A) = \frac{\mu_0}{2\pi}\left[\ln\left(\frac{21}{A} + \sqrt{\frac{4}{A^2}+1}\right) + \frac{3}{2}\cdot\left(\frac{A}{2} - \sqrt{\frac{A^2}{4}+1}\right)\right]$$

Here, $\kappa(A)$ is the inductance per length, $h_{substrate}$ is the substrate thickness, A is the aspect ratio A given by the quotient of capacitor-region diameter over substrate thickness, and $\mu_0$ is the magnetic field constant. Equation (2) is known from the calculation of the inductance of a through-via to ground (M. E. Goldfarb, R. A. Pucel, "Modeling Via Hole Grounds in Microstrip", IEEE Microwave and guided wave letters, Vol. 1, No. 6, June 1991). As the comparison between measured and calculated values shows, it is successfully applied here for the calculation of the inductance of a trench capacitor in low-resistivity silicon, as shown in FIG. 14. It is noted that equivalent results are obtained when assuming an arrangement of pores in an overall shape of a square.

The successful modeling of the measured inductance values by equation (2) proves the concept underlying the present disclosure, which is to achieve a reduction in self-inductance by making the current-path length in the substrate of a trench capacitor device as short as possible. According to equation (2), obviously, the inductance depends only on the substrate height and the aspect ratio A.

Figure 15:
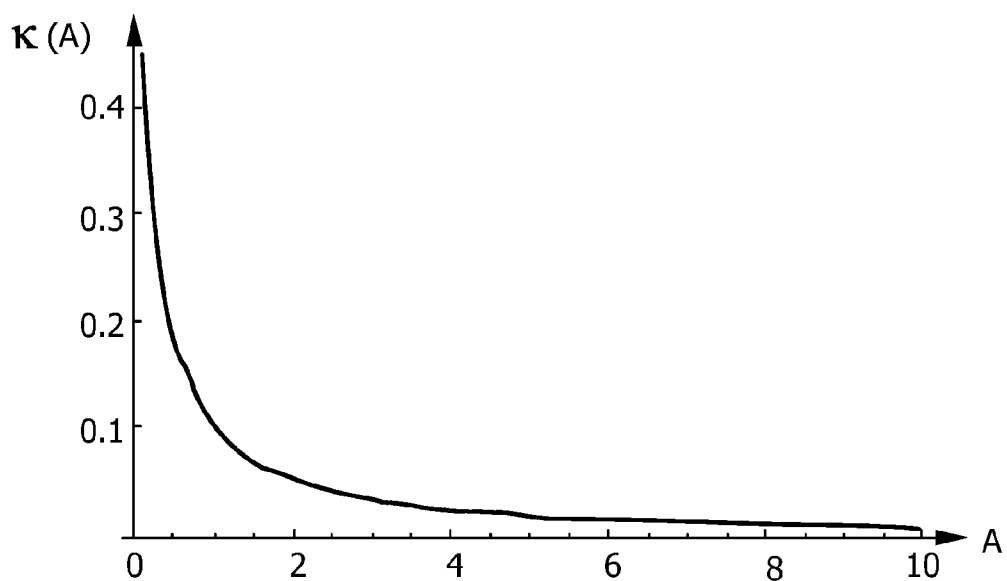
FIG. 15 is a diagram showing the calculated inductance per length κ as a function of the aspect ratio A, which is defined as the quotient of the capacitor diameter over the length of the current path region, of the trench capacitor in a capacitor device.

FIG. 15 is a diagram showing the calculated inductance per length $\kappa$ as a function of the aspect ratio of the trench capacitor in a capacitor device. The calculation was again performed using equation (2).

As can be seen from FIG. 15, $\kappa(A)$ is much lower if the aspect ratio is large. This advantageous constellation corresponds to a low substrate thickness and large diameter of the capacitor. Thus, for a given capacitor area, the inductance of the capacitor is reduced for thinner substrates due to two reasons: a) $k(A)$ is reduced due to the smaller aspect ratio of the capacitor, and b) the total current path length is reduced.

The total reduction in inductance with reduced substrate thickness is significant: for instance, a reduction of the substrate height from 300 µm to 50 µm leads to a reduction in the inductance from 25 pH to L=0.7 pH for a 400 µm by 400 µm capacitor; this is a factor 35 reduction of the inductance.

In short, this description relates to a capacitor device (500), an electronic circuit comprising a capacitor device, to an electronic component, and to a method of forming a capacitor device. In the capacitor device, a current-path region (530) extends from one of two trench capacitor electrodes to a respective contact structure (520). The current-path region of the capacitor device is obtainable by thinning the substrate from an original substrate thickness down to reduced substrate thickness either in a lateral substrate portion containing the capacitor region or over the complete lateral extension of the substrate before forming the first and second contact structures. The capacitor device has the advantage of exhibiting a reduced impedance in the current-path region. This reduced impedance implies a low self-inductance and self-resistance that is caused by the current-path region of the capacitor device. The low self-inductance provides an improved signal suppression over a broadened spectral range in a circuit configuration that employs the capacitor device as a bypass capacitor between a signal line and ground potential.

The invention claimed is:

1. A capacitor device, comprising:
    a substrate, the substrate having a first substrate side and an opposite second substrate side,
    a capacitor region embedded in the substrate and comprising at least one layer structure having a first and a second capacitor electrode electrically isolated from each other and having a U-shaped cross-sectional profile in a plane perpendicular to the first and second substrate sides, said first and second capacitor electrode being electrically connected to a first and a second (528) contact structure respectively, and
    a current-path region extending from the first capacitor electrodes to the first contact structure and configured to provide a path for an electrical current, wherein the substrate comprises a recess on the first substrate side in a lateral substrate portion containing the capacitor region, the recess having a bottom face with a contact element that is part of the first contact structure, so that the capacitor region and the current-path region are arranged between the contact element and the second contact structure on the second substrate side.

2. The capacitor device of claim 1, wherein the first contact structure is provided with at least two signal ports electrically connected with each other, one operating as input and the other as output, while the second contact structure is a ground connection.

3. The capacitor device of claim 2, wherein the signal ports of the first contact structure are arranged in an unrecessed portion on the first substrate side and connected to the contact element on the bottom face of the recess.

4. The capacitor device of claim 2, wherein the signal ports of the first contact structure are arranged on the second substrate side and connected to the contact element on the bottom face of the recess through contact lines extending from the first to the second substrate sides.

5. The capacitor device of claim 1, wherein the recessed lateral substrate portion has a thickness of at most 50 microns.

6. The capacitor device of claim 1, wherein the side faces of the recess are inclined by an angle of more than 90° with respect to the bottom face of the recess in a first recess section between the contact element and unrecessed portions of the first substrate side, and by an angle of 90° in a second recess section filled with the contact element.

7. The capacitor device of claim 1, wherein the current-path region is formed by a conductive substrate region that is arranged between the bottom face of the recess on the first substrate side and the capacitor region, and wherein, in the cross-sectional profile, a bottom of the U-shape points towards the bottom face of the recess.

8. The capacitor device of claim 1, wherein the current-path region is formed by a passivation layer covering the bottom face of the recess and being covered by the contact element.

9. The capacitor device of claim 1, wherein the current-path region is arranged between the capacitor region and the second contact structure on the second substrate side, and wherein, in the cross-sectional profile, the bottom of the U-shape points towards the second substrate side.

10. The capacitor device of claim 1, wherein lateral extensions of the current-path region equal lateral extensions of the capacitor region, and wherein the current-path region has a lower electrical resistivity than laterally adjacent areas of the substrate.

11. A broadband system comprising a semiconductor device that processes signals at least one frequency and as a bypass capacitor the capacitor device as claimed in claim 1.

12. A broadband system as claimed in claim 11, wherein the capacitor device comprises a plurality of bond pads and interconnect lines and the semiconductor device is assembled to the first side of the substrate.

13. A broadband system as claimed in claim 11, wherein through-vias extend through the substrate from the first to the second side of the substrate, so that the substrate can be assembled with its second side to a carrier.

14. A broadband system as claimed in claim 11, wherein the capacitor device is present.

15. An electronic component comprising a carrier substrate and, mounted on the carrier substrate, a capacitor device according to claim 1.

16. A method for manufacturing a capacitor device, comprising the steps of:
  providing a substrate having a first substrate side and an opposite second substrate side,
  thinning the substrate from an original substrate thickness down to a reduced substrate thickness in a lateral substrate portion containing the capacitor region,
  forming a capacitor region embedded in the predetermined lateral portion of the substrate by producing at least one layer structure having a first and a second capacitor electrodes isolated from each other and having a U-shaped cross-sectional profile in a plane perpendicular to the first and second substrate sides,
  forming a first contact structure and forming a second contact structure,
  providing a current-path region in the thinned lateral portion of the substrate and thereby electrically coupling a predetermined one of the capacitor electrodes to the respective contact structure.

17. The method of claim 16,
  wherein the step of thinning the substrate comprises forming a recess on the first substrate side, the recess having a bottom face,
  wherein the step of forming the first contact structure comprises connecting its signal ports with each other through a contact element on the bottom face of the recess, and
  wherein the step of providing the current-path region comprises providing the current-path region between the contact element on the bottom face of the recess and the second contact structure on the second substrate side.

* * * * *